(12) United States Patent  
Zhang et al.

(10) Patent No.: US 8,183,470 B2
(45) Date of Patent: May 22, 2012

(54) SHIELDING CAGE HAVING IMPROVED GASKET

(75) Inventors: Xin-Jie Zhang, Kunshan (CN); Chun-Hsiung Hsu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 315 days.

(21) Appl. No.: 12/477,936

(22) Filed: Jun. 4, 2009

(65) Prior Publication Data
US 2009/0301773 A1 Dec. 10, 2009

(30) Foreign Application Priority Data

Jun. 4, 2008 (CN) .......................... 2008 1 0123425

(51) Int. Cl.
*H01R 13/648* (2006.01)
*H05K 9/00* (2006.01)
(52) U.S. Cl. ..... 174/359; 174/377; 174/369; 439/607.2; 439/607.17
(58) Field of Classification Search .................. 174/359, 174/368, 377, 369; 361/816; 439/607.2, 439/607.17
See application file for complete search history.

(56) References Cited

U.S. PATENT DOCUMENTS

| 6,943,287 | B2 | 9/2005 | Lloyd et al. | |
| 7,598,462 | B2* | 10/2009 | Burca et al. | 174/564 |
| 7,612,299 | B2* | 11/2009 | Chen | 174/359 |
| 7,710,734 | B2* | 5/2010 | Ice et al. | 361/730 |
| 2003/0169581 | A1* | 9/2003 | Bright et al. | 361/816 |
| 2006/0279937 | A1* | 12/2006 | Manson et al. | 361/724 |
| 2007/0280604 | A1* | 12/2007 | Jablonski et al. | 385/92 |
| 2008/0047746 | A1* | 2/2008 | Chen et al. | 174/369 |
| 2009/0050360 | A1* | 2/2009 | Chen | 174/351 |

FOREIGN PATENT DOCUMENTS

CN 1833341 A 9/2006

* cited by examiner

*Primary Examiner* — Hung Ngo
(74) *Attorney, Agent, or Firm* — Wei Te Chung; Andrew C. Cheng; Ming Chieh Chang

(57) ABSTRACT

A shielding cage (1) partially mounted to an opening (31) defined through a panel (3) for at least an electrical module. The shielding cage has a cage body (13) and a gasket (14) mounted around a front portion of the cage body. The cage body has a number of side walls (100) and a front opening (101) defined between the side walls for receiving the electrical module. The gasket (14) has a base (142) resisting against a side face of the panel, and a horizontal portion (141) extending from the base and into the opening of the panel for firmly abutting against the inner surface of the opening.

14 Claims, 6 Drawing Sheets

SHIELDING CAGE HAVING IMPROVED GASKET

BACKGROUND OF THE INVENTION

1. Field of the Invention

The present invention relates to a shielding cage, and more particularly to a shielding cage with improved gasket arranged between circumference and an opening of the panel to effectively reduce electromagnetic interference leakage.

2. Description of the Prior Art

A small form-factor pluggable transceiver (SFP transceiver) provides a link between an electronic transmission line and an optical transmission line as a bi-direction optical-electronic converter. The SFP transceiver is mounted on a printed circuit board of a host system device via a high-speed connector. Then SFP transceiver and the connector are received in a shielding cage to avoid EMI.

U.S. Pat. No. 6,943,287 issued to Lloyd on May 24, 2007 discloses a transceiver cage for receiving EMI-minimized transceiver. The transceiver cage is mounted to a opening of the panel and has a cage body, a supporting member partially enclosing the cage body, a gasket located adjacent to the supporting member and having one side face abutting against the supporting member and another opposite side face resisting against a side surface of the panel. The cage body is of rectangular configuration and has a receiving space for receiving the EMI-minimized transceiver.

However, It is difficult to effectively avoid EMI due to an electromagnetic leakage from a gap formed between the side surface of the panel and the gasket.

Hence, an improved shielding cage is needed to solve the above problem.

BRIEF SUMMARY OF THE INVENTION

Object of the present invention is to provide a shielding cage could effectively avoid an electromagnetic interference.

The present invention provides a shielding cage mounted through a panel for receiving an electrical module. The shielding cage comprises cage body and a gasket mounted around a front portion of the cage body. The cage body has a plurality of side walls and a front opening defined between the side walls for receiving the electrical module. The gasket comprises a base abutting against a side face of the panel, and a horizontal portion inserted into an opening of the panel for firmly and flexibly abutting against an inner surface of the panel in which the opening is defined.

Advantage of the present invention is to provide a gasket having a protruding portion extending into the opening of the panel and sandwiched between the interior surface of the opening of the panel and an outside surface of the cage body for sealing off.

Other objects, advantages and novel features of the invention will become more apparent from the following detailed description of the present embodiments when taken in conjunction with the accompanying drawings.

DETAILED DESCRIPTION OF THE INVENTION

Figure 1:
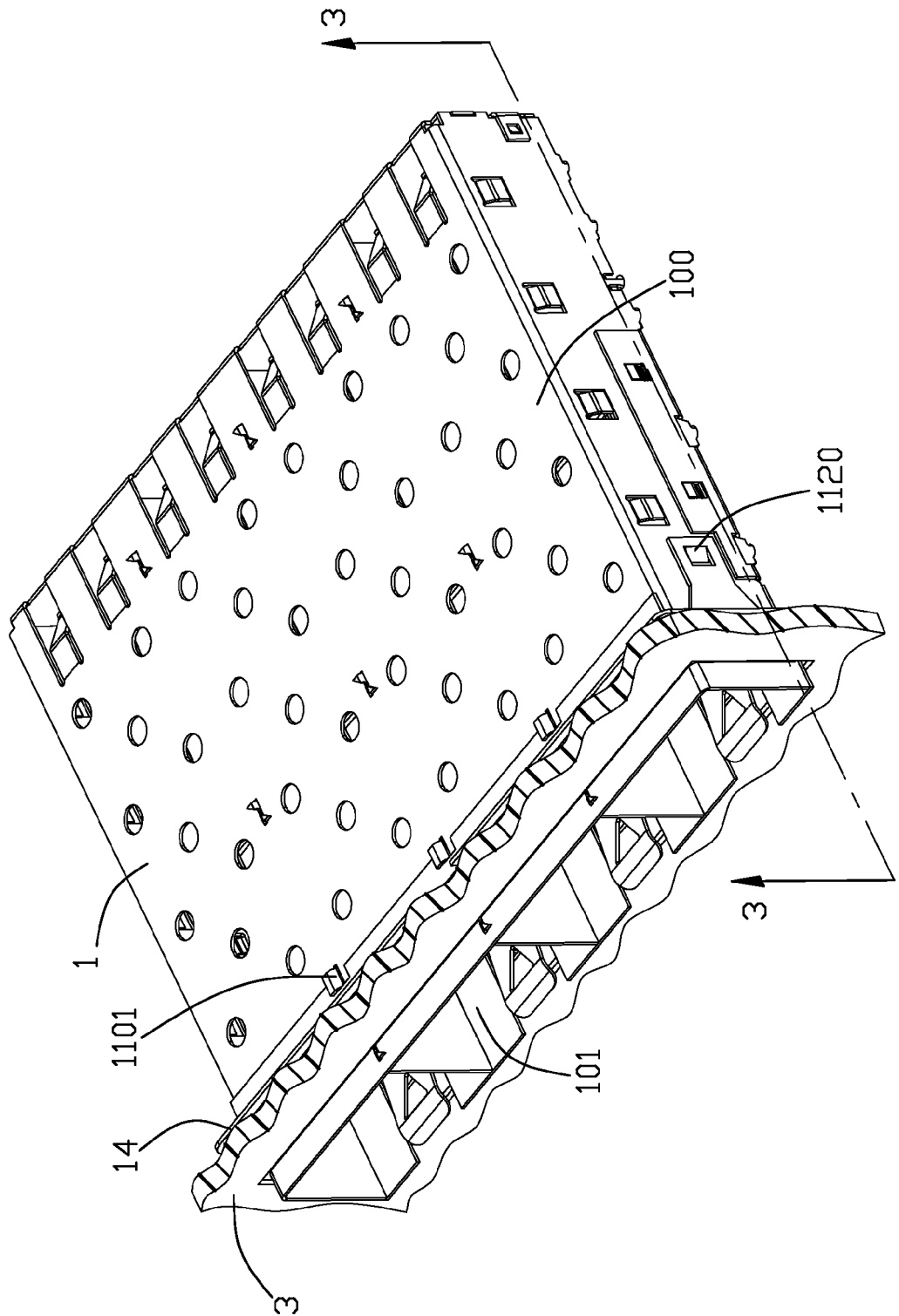
FIG. 1 is an assembled perspective view of a shielding cage mounted through a panel in accordance with a first embodiment.
Figure 2:
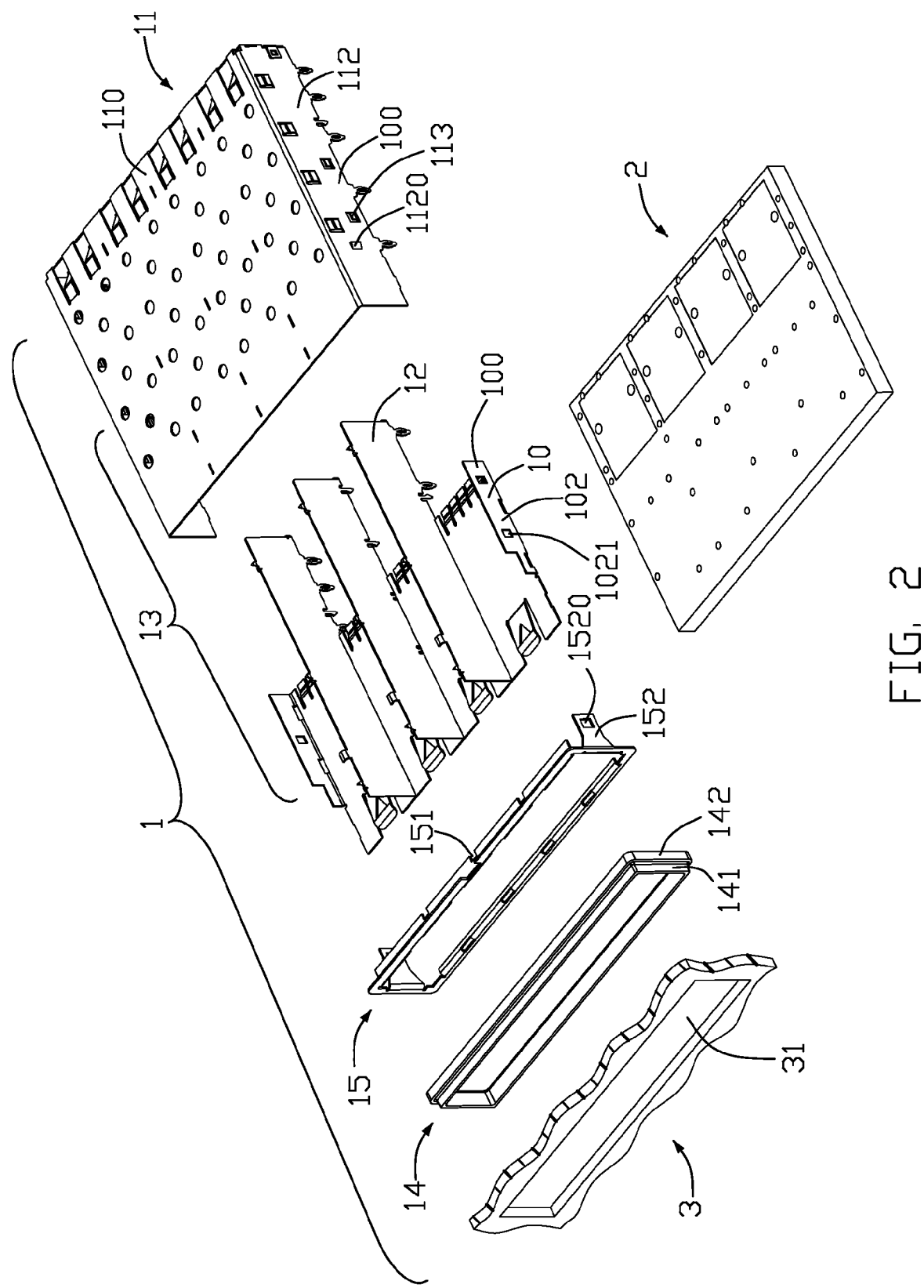
FIG. 2 is an exploded view of the shielding cage and a printed circuit board on which the shielding cage is mounted.
Figure 3:
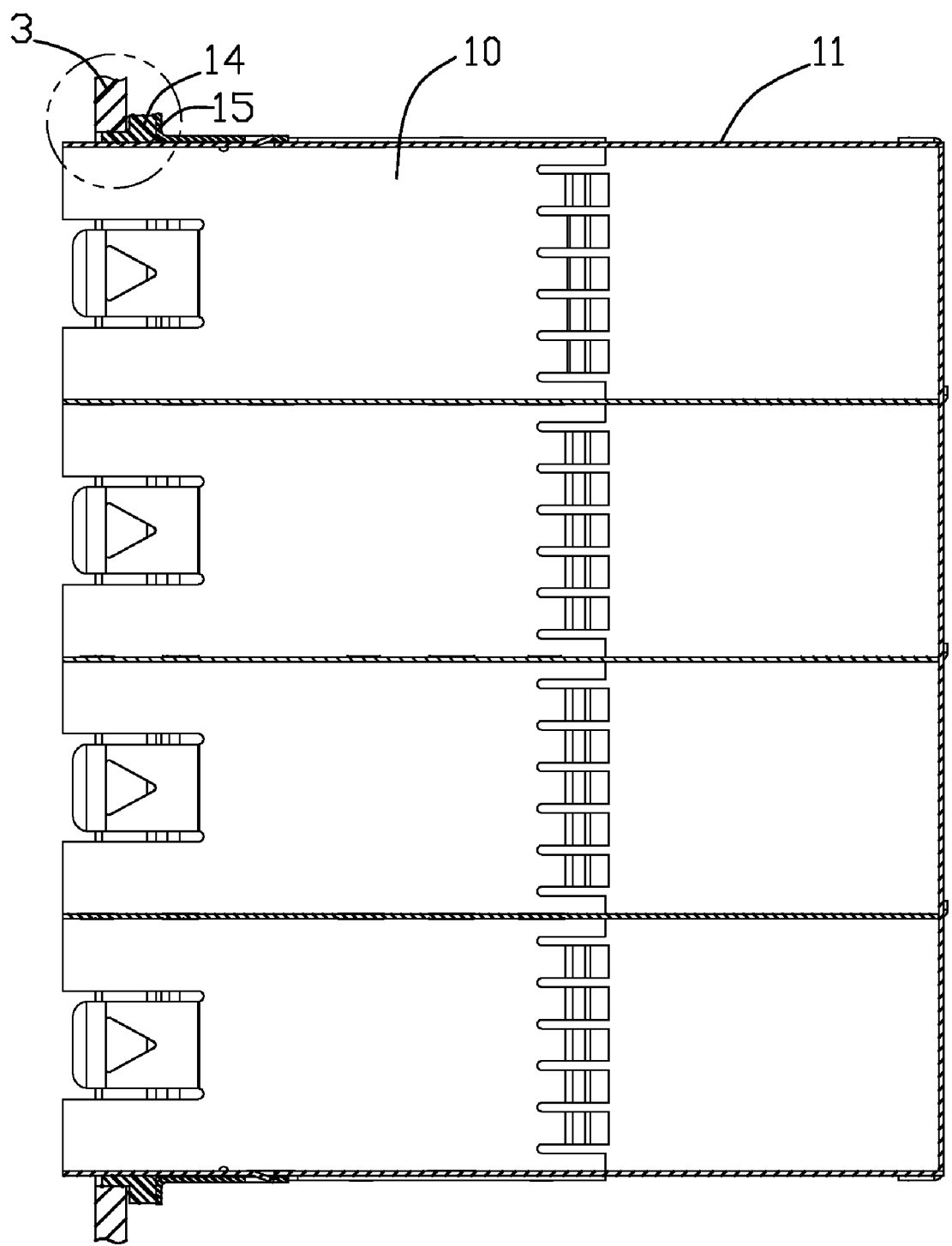
FIG. 3 is a cross-sectional view of the shielding cage taken along line 3-3 of FIG. 1.
Figure 4:
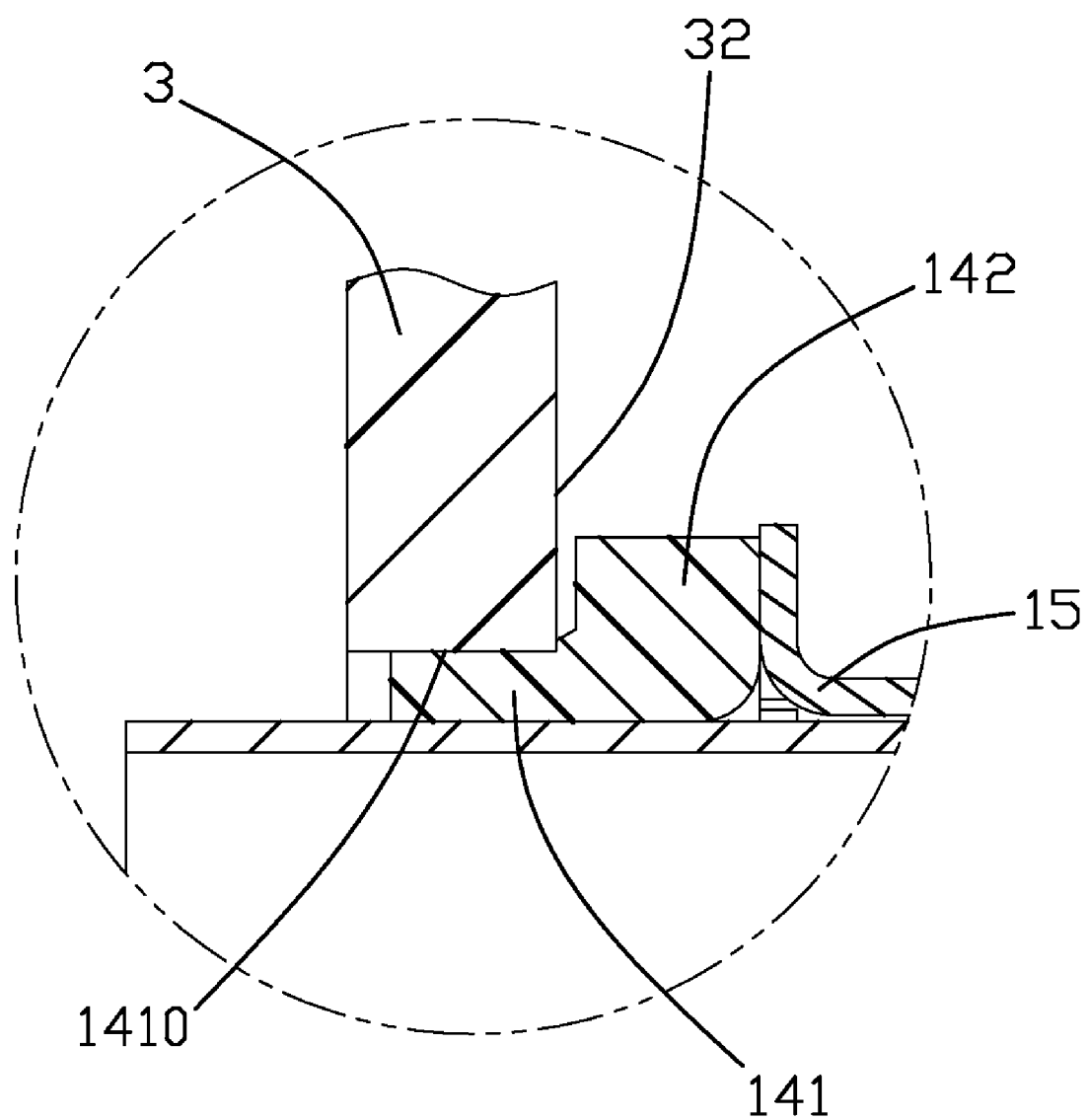
FIG. 4 is a magnified view of a gasket of the shielding cage, as especially labeled in FIG. 3.

Reference will now be made to the drawing figures to describe the present invention in detail. Referring to FIGS. 1-4, a shielding cage 1 mounted on a printed circuit board 2 for receiving electrical modules (not shown) comprises a cage body 13, a gasket 14 enclosing the cage body 13 and a supporting member 15 encircling the cage body 13.

The cage body 13 has a plurality of side walls 100 and a front opening 101 defined between the side walls 100. The cage body 13 has a top portion 11, a bottom portion 10 locked with the top portion 11 and a plurality of interior walls 12 parallel arranged on the bottom portion 10 to divide the opening 101 into a plurality of small rooms for receiving a number of electrical modules. Each of the interior walls 12 comprises a tab 1101. The top portion 11 has a pair of flanges 112 bending downwardly therefrom and a plurality of notches 113 defined on the flanges 112. The bottom portion 10 has a pair of side plates 102 extending upwardly from opposites edge portions thereof and a plurality of embosses 1021 coupling with the notches 113 of the top portion 11.

The supporting member 15 surrounds the side walls 100 of the cage body 13 and resists against the gasket 14. The supporting member 15 comprises a plate 152 defining a recess 1520 therethrough, and a plurality of notches 151. The tabs 1101 of the interior walls 12 extend through the top portion 11 of the cage body 13 to be received in the notches 151 and are bent to abut against the supporting member 15. The flange 112 of the top portion 11 has a guiding protrusion 1120 locking with the recess 1520 of the plate 152.

Figure 5:
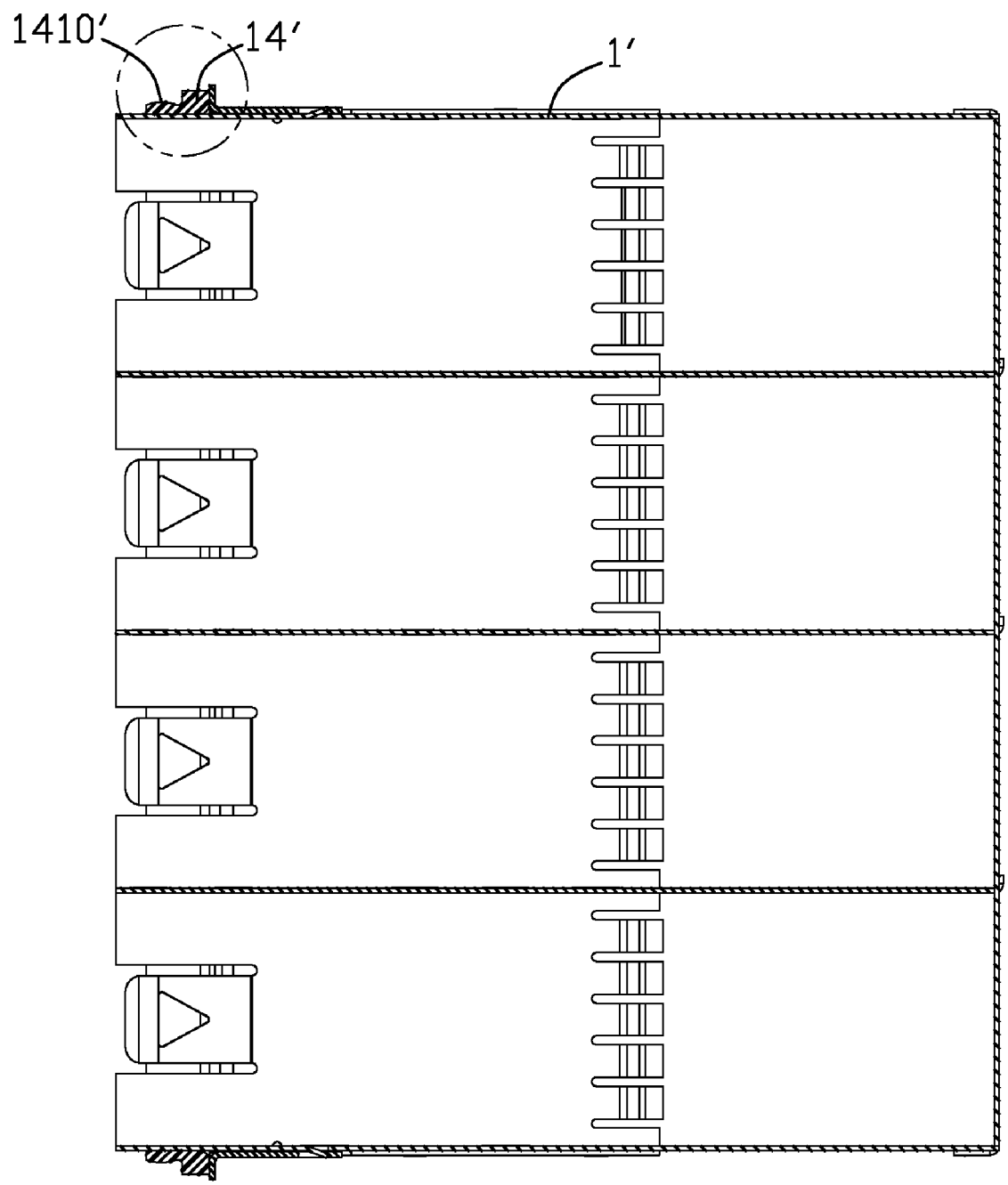
FIG. 5 is a cross-sectional view of the shielding cage in accordance with a second embodiment.
Figure 6:
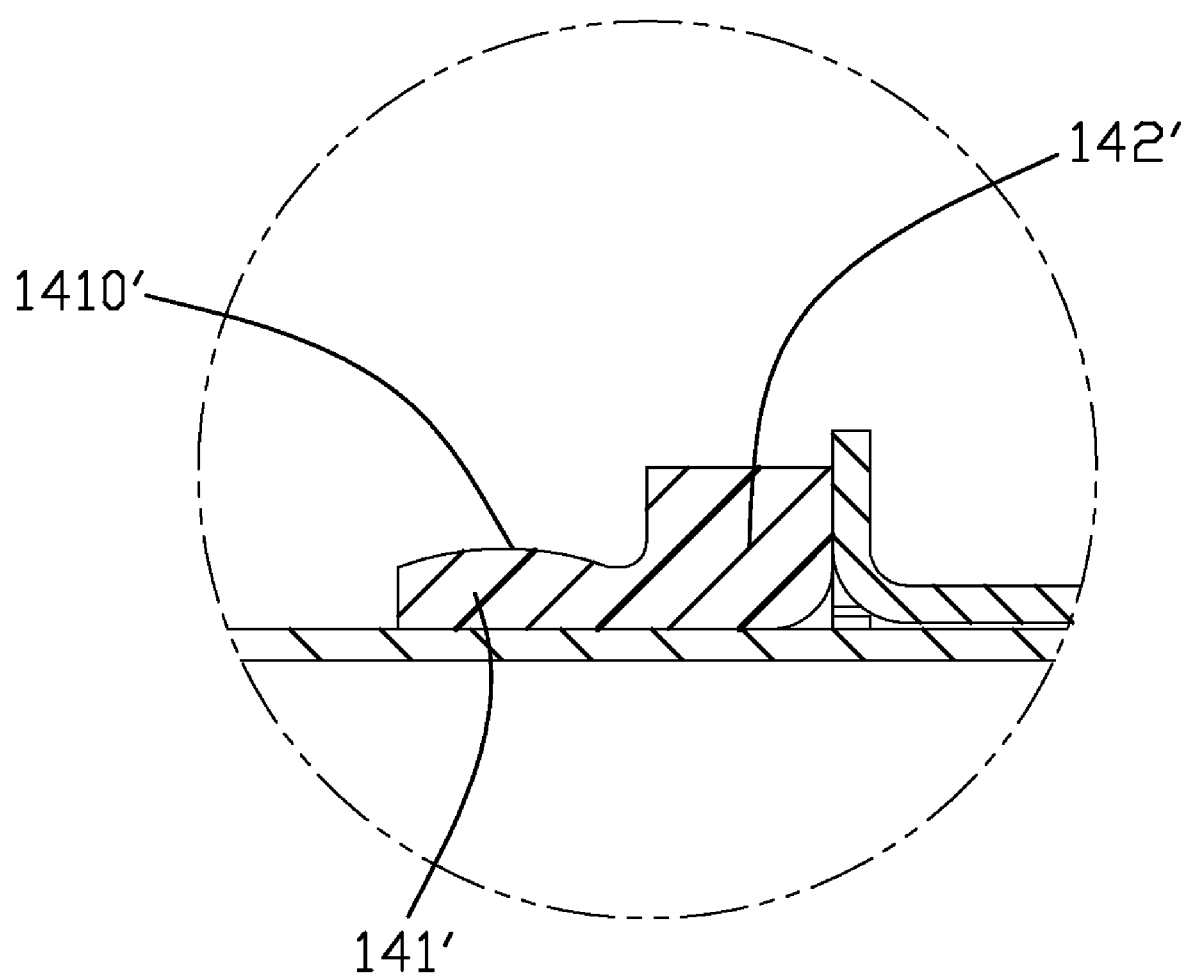
FIG. 6 is a magnified view of a gasket of the shielding cage, as especially labeled in FIG. 5.

The gasket 14 is located between the supporting member 15 and the panel 3 and mounted around a front portion of the side walls 100 of the cage body 13. The gasket 14 comprises a base 142 abutting against a side face of the panel 3, and a horizontal portion 141 extending from the base 142 and into the opening 31 of the panel 3 for firmly and flexibly abutting against the inner surface of the opening 31. The base 142 is perpendicular to the horizontal portion 141. The protruding portion 141 has a slantwise surface 1410 for interfering with the inner surface of the opening 31 of the panel 3. In another embodiment, as shown in FIGS. 5 and 6, the protruding portion 141' has an arc-like surface 1410' for interfering with the inner surface of the opening 31 of the panel 3.

During assembling, firstly, the top and the bottom portions 11 and 10 of the side walls 100 are locked together. Secondly, the supporting member 15 encloses the side walls 100 of the cage body 13. The recess 1520 of the supporting member 15 engages with the guiding protrusion 1120 of the flange 112. Thirdly, the gasket 14 encloses the side walls 100 of the cage body 13. Finally, the cage body 13 is mounted to the opening 31 of the panel 3. The protruding portion 141 of the gasket 14 extends into the opening 31 of the panel 3 and is sandwiched between the interior surface of the opening 31 and an outside surface 110 of the top portion 11 for providing electromagnetic leakage proof effect.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A shielding cage defined through a panel for receiving at least an electrical module, said shielding cage comprising:
   a cage body having a plurality of side walls and an front opening defined between the side walls for receiving the electrical module; and
   a gasket surrounding the cage body and arranged adjacent to the front opening, the gasket comprising a base abutting against a side face of the panel, and a horizontal portion extending from the base, and having a thickness thinner than a thickness of the base before the gasket mounted on the panel, the horizontal portion being inserted into an opening of the panel for firmly and flexibly abutting against an inner surface of the panel in which the opening is defined.

2. The shielding cage as claimed in claim 1, wherein said base of gasket is perpendicular to the horizontal portion of the gasket.

3. The shielding cage as claimed in claim 1, wherein said protruding portion has a slantwise surface for interfering with the inner surface of the opening of the panel.

4. The shielding cage as claimed in claim 1, wherein said protruding portion has an arc-like surface for interfering with the inner surface of the opening of the panel.

5. The shielding cage as claimed in claim 1, further comprising a supporting member enclosing the side walls of the cage body and resisting against the gasket, the gasket located between the supporting member and the panel.

6. The shielding cage as claimed in claim 5, wherein said supporting member comprises a plate defining a recess therethrough, the side wall of the cage body has a guiding protrusion locking with the recess of the plate.

7. The shielding cage as claimed in claim 1, wherein said side walls has a top portion and a bottom portion separated from the top portion, the top portion having a plurality of embosses disposed thereon, and the bottom portion having a plurality of notches for coupling with the embosses of the top portion.

8. The shielding cage as claimed in claim 1, wherein said cage body comprises an array of interior walls perpendicularly located on the bottom shield for dividing the front opening into a plurality of small rooms, each small room being adapted for receiving corresponding electrical module.

9. The shielding cage as claimed in claim 1, wherein said gasket is made of rubber material.

10. A shield cage assembly comprising:
    a cage body including a plurality of side walls commonly defining a receiving space therein;
    a metallic panel defining an opening surrounded by inner edges of the panel, into which a front portion of the cage body extends with a sideward gap therebetween, said gap defining a depth corresponding to a thickness of the panel in affront-to-back direction; and
    a gasket inherently configured to tightly fill a majority of said depth of said gap sidewards.

11. The shield cage assembly as claimed in claim 10, wherein a cross-section of said gasket defines inherently at least an L-shaped configuration including a first face forwardly intimately confronting a back surface of the panel, and a second face sidewardly engaging said inner edges.

12. The shield cage assembly as claimed in claim 11, wherein said cage body is further equipped with a flange like supporting member to abut against a back region of the gasket.

13. The shield cage assembly as claimed in claim 12, wherein the supporting member comprises a rearwardly extending plate locking with the side wall.

14. A shield cage assembly comprising:
    a cage body including a plurality of side walls commonly defining a receiving space therein;
    a metallic panel defining an opening surrounded by an inner edges of the panel, into which a front portion of the cage extends with a sideward gap therebetween; and
    a gasket tightly filling said gap sidewards; wherein
    said cage body is further equipped with a flange like supporting member to abut against a back region of the gasket, wherein
    said gasket is inherently configured with an L-shaped cross-section having a first face forwardly intimately confronting a back surface of the panel, and a second face sidewardly engaging said inner edges; wherein said supporting member defines a plurality of notches, the cage body comprising a plurality of interior walls, each of the interior walls having a tab, the tabs extending through the cage body to be received in the notches and being bent to abut against the supporting member.

* * * * *